(12) United States Patent
More et al.

(10) Patent No.: US 10,535,736 B2
(45) Date of Patent: Jan. 14, 2020

(54) FULLY STRAINED CHANNEL

(71) Applicant: Taiwan Semiconductor Manufacturing Co., Ltd., Hsinchu (TW)

(72) Inventors: Shahaji B. More, Zhubei (TW); Huai-Tei Yang, Hsin-Chu (TW); Zheng-Yang Pan, Zhubei (TW); Shih-Chieh Chang, Taipei (TW); Chun-Chieh Wang, Kaohsiung (TW); Cheng-Han Lee, New Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/719,046

(22) Filed: Sep. 28, 2017

(65) Prior Publication Data

US 2019/0096997 A1 Mar. 28, 2019

(51) Int. Cl.
| | |
|---|---|
| *H01L 29/10* | (2006.01) |
| *H01L 21/8238* | (2006.01) |
| *H01L 21/74* | (2006.01) |
| *H01L 21/02* | (2006.01) |
| *H01L 21/3065* | (2006.01) |

(Continued)

(52) U.S. Cl.
CPC .... *H01L 29/1054* (2013.01); *H01L 21/02645* (2013.01); *H01L 21/308* (2013.01); *H01L 21/3065* (2013.01); *H01L 21/74* (2013.01); *H01L 21/823807* (2013.01); *H01L 21/823821* (2013.01); *H01L 21/823878* (2013.01); *H01L 21/823892* (2013.01); *H01L 27/0924* (2013.01); *H01L 27/0928* (2013.01); *H01L 29/0653* (2013.01); *H01L 29/1083* (2013.01); *H01L 21/02532* (2013.01); *H01L 21/02661* (2013.01)

(58) Field of Classification Search
CPC ........... H01L 29/1054; H01L 21/02532; H01L 27/0928; H01L 27/0924; H01L 21/308; H01L 21/3065; H01L 21/02645; H01L 21/823821; H01L 21/02661; H01L 21/74; H01L 21/823807; H01L 21/823878; H01L 21/823892
See application file for complete search history.

(56) References Cited

U.S. PATENT DOCUMENTS

| | | | |
|---|---|---|---|
| 2014/0077279 A1* | 3/2014 | Tu ...................... | H01L 21/02532 257/288 |
| 2015/0270122 A1* | 9/2015 | Tolle .................. | H01L 21/02301 438/607 |

(Continued)

*Primary Examiner* — Julia Slutsker
(74) *Attorney, Agent, or Firm* — Sterne, Kessler, Goldstein & Fox P.L.L.C.

(57) ABSTRACT

The present disclosure describes an exemplary method to form p-type fully strained channel (PFSC) or an n-type fully strained channel (NFSC) that can mitigate epitaxial growth defects or structural deformations in the channel region due to processing. The exemplary method can include (i) two or more surface pre-clean treatment cycles with nitrogen trifluoride ($NF_3$) and ammonia ($NH_3$) plasma, followed by a thermal treatment; (ii) a prebake (anneal); and (iii) a silicon germanium epitaxial growth with a silicon seed layer, a silicon germanium seed layer, or a combination thereof.

20 Claims, 11 Drawing Sheets

(51) Int. Cl.
*H01L 21/308* (2006.01)
*H01L 27/092* (2006.01)
*H01L 29/06* (2006.01)

(56) References Cited

U.S. PATENT DOCUMENTS

| | | | |
|---|---|---|---|
| 2015/0348966 A1* | 12/2015 | Zhao | H01L 27/0886 257/401 |
| 2016/0049335 A1* | 2/2016 | Liu | H01L 21/823431 438/283 |
| 2016/0148932 A1* | 5/2016 | Fujita | H01L 27/0921 257/372 |
| 2016/0308048 A1* | 10/2016 | Ching | H01L 29/7848 |
| 2017/0250183 A1* | 8/2017 | Brunco | H01L 27/0924 |

* cited by examiner

FULLY STRAINED CHANNEL

BACKGROUND

A fully strained channel in a complementary metal oxide semiconductor (CMOS) device can improve carrier mobility and reduce channel resistance of the device. Additionally, a strain-induced drive current enhancement (due to carrier mobility improvements) can be retained for CMOS devices with scaled channel lengths.

BRIEF DESCRIPTION OF THE DRAWINGS

Aspects of the present disclosure are best understood from the following detailed description when read with the accompanying figures. It is noted that, in accordance with the common practice in the industry, various features are not drawn to scale. In fact, the dimensions of the various features may be arbitrarily increased or reduced for clarity of discussion.

DETAILED DESCRIPTION

Figure 1:
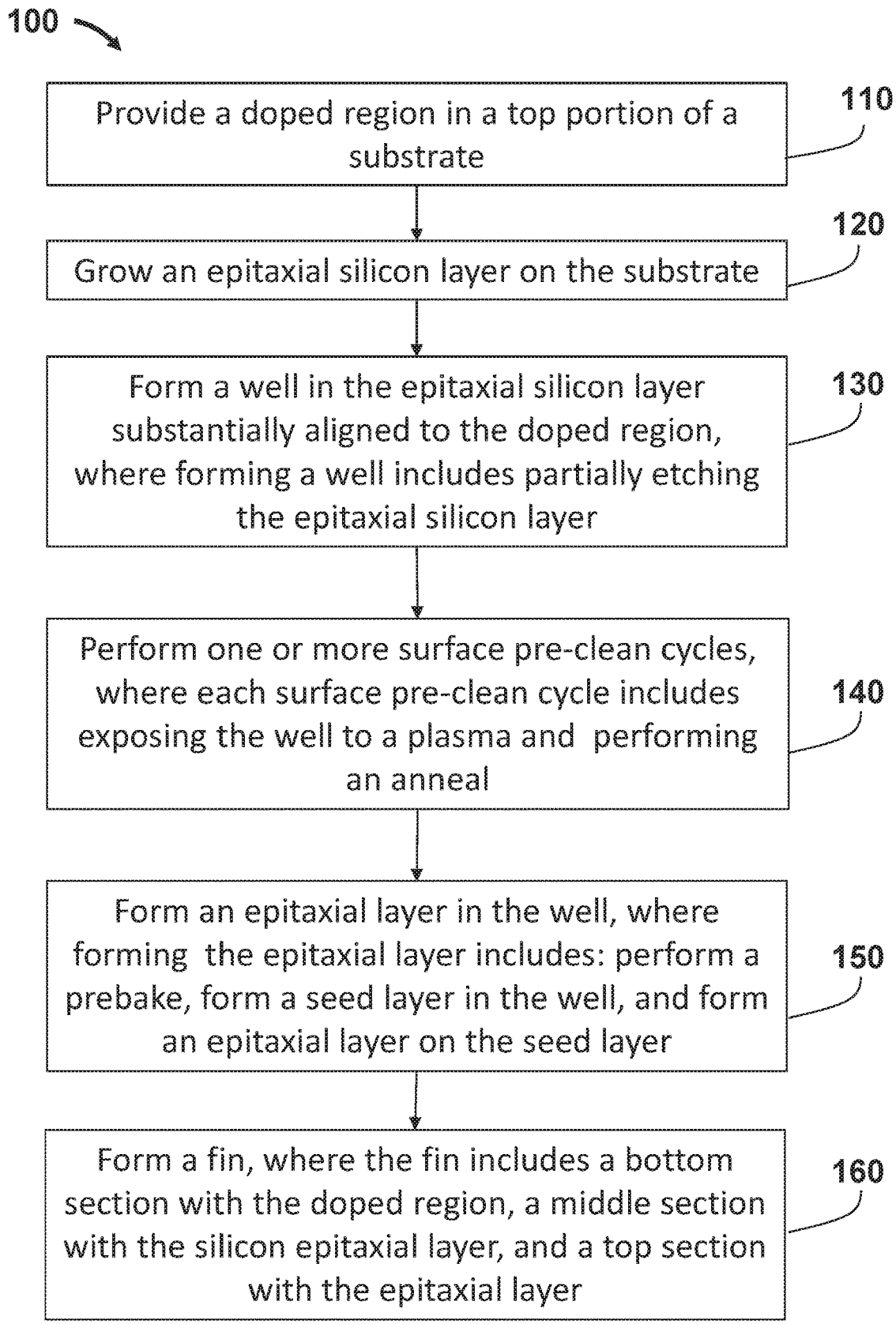
FIG. 1 is a flow chart diagram of an exemplary fabrication method for the formation of a fully strained channel region on a fin, according to some embodiments

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The acronym "FET," as used herein, refers to a field effect transistor. A type of FET is referred to as a metal oxide semiconductor field effect transistor (MOSFET). MOSFETs can be planar structures built in and on the planar surface of a substrate such as a semiconductor wafer. MOSFETs can also be three-dimensional, vertically-oriented structures with a semiconductor material called fins. The term "finFET" refers to a FET that is formed over a semiconductor (e.g., silicon) fin that is vertically oriented with respect to the planar surface of a wafer.

The expression "epitaxial layer" herein refers to a layer or structure of crystalline material. Likewise, the expression "epitaxially grown" herein refers to the process of growing a layer, or structure, of crystalline material. Epitaxially grown material may be doped or undoped.

The term "nominal" as used herein refers to a desired, or target, value of a characteristic or parameter for a component or a process operation, set during the design phase of a product or a process, together with a range of values above and/or below the desired value. The range of values can be due to slight variations in manufacturing processes or tolerances. Unless defined otherwise, technical and scientific terms used herein have the same meanings as commonly understood by one of ordinary skill in the art to which this disclosure belongs.

A fully strained channel in a complementary metal oxide semiconductor (CMOS) device can improve carrier mobility and reduce channel resistance of the device. Additionally, a strain-induced drive current enhancement (due to carrier mobility improvements) can be retained for CMOS devices with scaled channel lengths. The materials used in strained channels can be different for p-type field effect transistors (PFETs) and n-type field effect transistors (NFETs). By way of example and not limitation, electron mobility in an NFET can be enhanced with the use of fully strained silicon/ carbon-doped silicon (Si/Si:C) channels, while hole mobility in PFETs can be enhanced with fully strained silicon germanium (SiGe) channels.

The fully strained epitaxial channels can be formed from epitaxial layers disposed on a top portion of a silicon (Si) fin. The formation process of fully strain channels requires numerous photolithography, etch, pre-treatment, anneal and growth operations. Some of these operations can be challenging and may lead to undesirable effects-such as deformation of the channel region (e.g., non-vertical sidewalls) and epitaxial growth defects (e.g., stacking faults) due to the presence of stress in the epitaxially grown layers. These undesirable effects can offset the mobility benefits of the fully strained channel. A p-type fully strained channel (PFSC) can be susceptible to defects where the Si to SiGe lattice mismatch is larger, for example, compared to an n-type fully strained channel (NFSC) where Si, Si:C, or a combination thereof can be used.

The embodiments described herein are directed to an exemplary fabrication method of PFSC that can mitigate epitaxial growth defects or structural deformations of the channel region due to processing. According to some embodiments, the exemplary fabrication process may include (i) two or more surface pre-clean treatment cycles with nitrogen trifluoride ($NF_3$) and ammonia ($NH_3$) plasma, followed by a thermal treatment; (ii) a prebake (anneal), and (iii) a SiGe epitaxial growth with a Si seed layer, a SiGe seed layer, a Si:C seed layer, or a combination thereof. The exemplary fabrication method described above can also be implemented for the formation of an NFSC, where operation (iii) may be replaced with a Si:C epitaxial growth with a Si seed layer.

FIG. 1 is a flow chart diagram of an exemplary fabrication 100. Fabrication process 100 can form an p-type, fully strained, SiGe channel region in a top portion of a fin where a transistor can have its channel. In some embodiments, exemplary fabrication method 100 can provide a SiGe channel region that can be substantially free from structural deformations and epitaxial growth defects, such as stacking faults. Other fabrication operations may be performed between the various operations of exemplary fabrication method 100 and are omitted for clarity. Exemplary fabrication method 100 may not be limited to the operations described below and may include additional operations.

For example purposes, exemplary fabrication method 100 will be described in the context of PFSC formed in a top portion of a silicon fin. Based on the disclosure herein, PFSCs can also be formed in planar transistors. Planar transistors are also within the spirit and scope of this disclosure. Additionally, as discussed above, exemplary fabrication method 100 can be used to form an NFSC.

Figure 2:
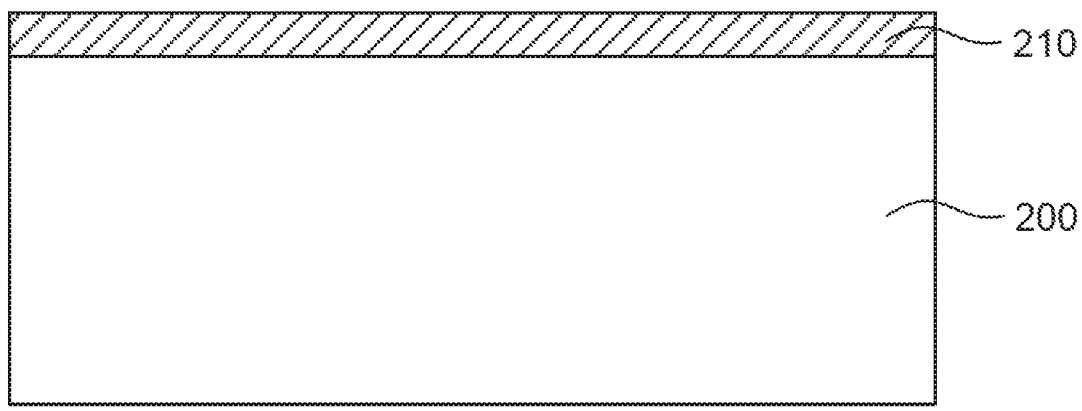
FIG. 2 is a cross sectional view of a substrate with an oxide layer grown thereon, according to some embodiments.

Exemplary process 100 begins with operation 110, where an n-type region is formed in a top portion of a substrate. By way of example and not limitation, an n-type region can be formed as follows. Referring to FIG. 2, an oxide layer 210 is deposited on a substrate 200. In some embodiments, substrate 200 can be a bulk semiconductor wafer or a semiconductor on insulator (SOI) wafer. Further, substrate 200 can be made of silicon (Si) or another elementary semiconductor such as, for example, (i) germanium (Ge); (ii) a compound semiconductor including silicon germanium (SiGe), silicon carbide (SiC), gallium arsenide (GaAs), gallium phosphide (GaP), indium phosphide (InP), indium arsenide (InAs), and/or indium antimonide (InSb); (iii) an alloy semiconductor including silicon germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), and/or gallium indium arsenide phosphide (GaInAsP); or (iv) combinations thereof. For example purposes, substrate 200 in exemplary fabrication method 100 will be described in the context of silicon (e.g., single crystal). Based on the disclosure herein, other materials, as discussed above, can be used. These materials are within the spirit and scope of this disclosure.

In some embodiments, oxide layer 210 can have a thickness that can range from about 30 Å to about 150 Å (e.g., 30 Å to 90 Å). In some embodiments, oxide layer 210 is a silicon oxide ($SiO_2$) layer. According to some embodiments, oxide layer 210 can protect the top surface of substrate 200 from contamination, prevent excessive damage to substrate 200 during ion implantation, and can control the depth of dopants during an ion implantation step.

Figure 3:
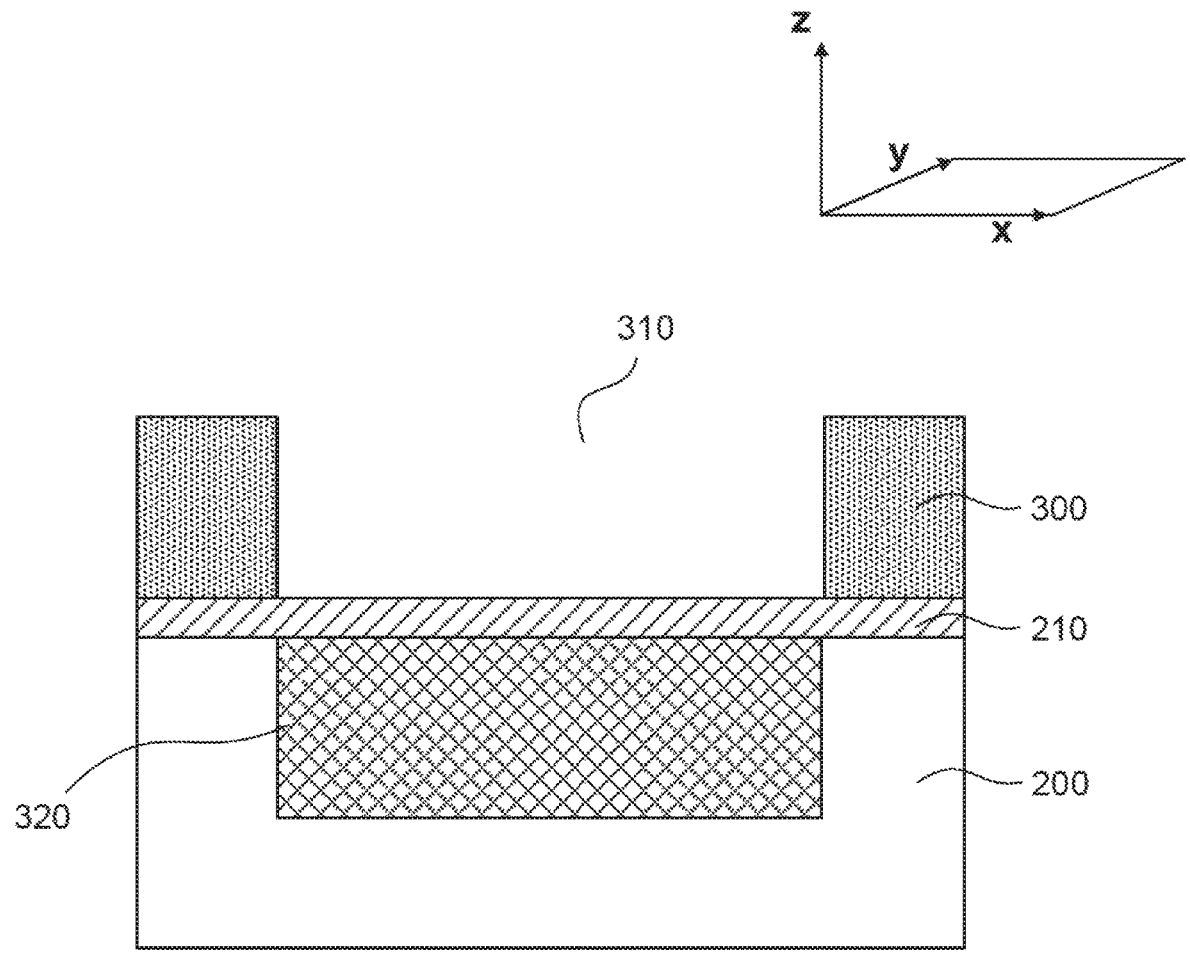
FIG. 3 is a cross sectional view of an opening in a photoresist layer and aligned to a n-type region, according to some embodiments.

A photoresist layer 300 can then be deposited over oxide layer 210 as shown in FIG. 3. According to some embodiments, photoresist layer 300 can be patterned so that an opening 310 is formed over a portion of oxide layer 210, as shown in FIG. 3. In some embodiments, ion implantation can be used to form, for example, an n-type region 320 in substrate 200. In some embodiments, n-type region 320 is substantially aligned to opening 310 since photoresist layer 300 can act as an implant mask. According to some embodiments, the n-type dopant may include (As), antimony (Sb), or phosphorous (P). According so some embodiments, the n-type dopant concentration in n-type region 320 can range from about $5\times10^{16}$ atoms/cm$^3$ to about $1\times10^{19}$ atoms/cm. By way of example and not limitation, n-type region 320 can have a depth (e.g., z-direction) of about 100 nm to about 500 nm. However, the width (e.g., along the x-direction) and length (e.g., along the y-direction) can vary depending on the device (e.g., logic, static random access memory (SRAM), etc.) After the formation of the n-type region, photoresist layer 300 can be removed.

Figure 4:
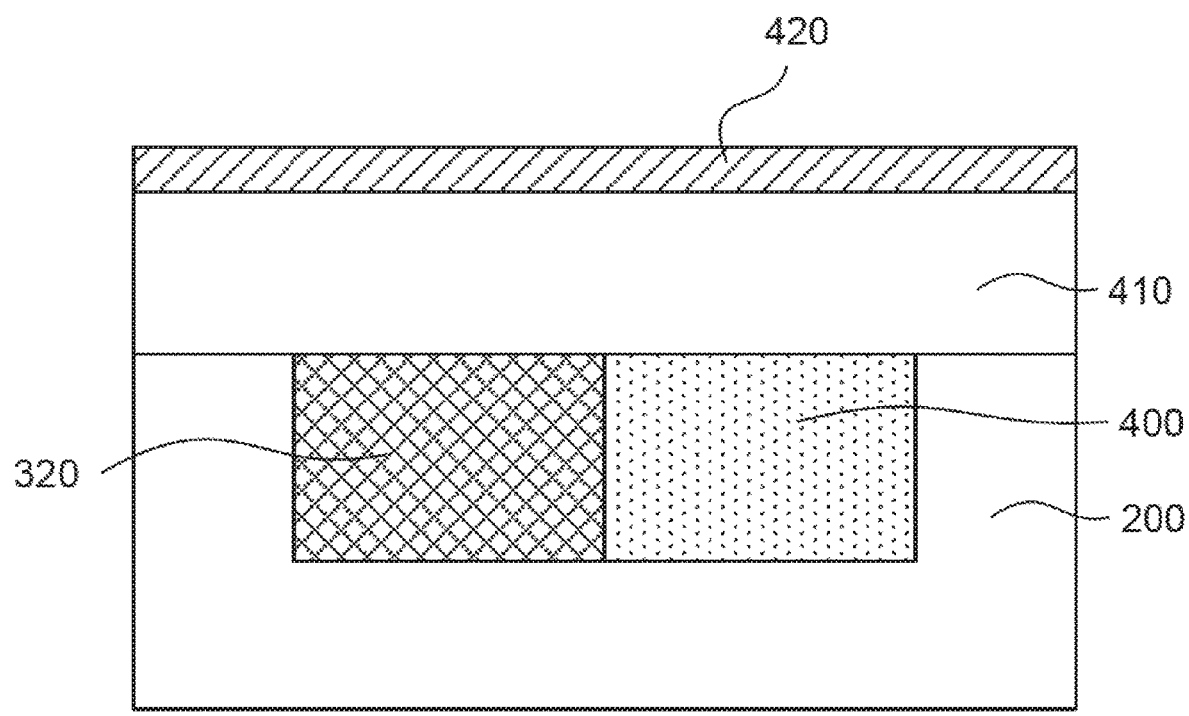
FIG. 4 is a cross sectional view of a silicon epitaxial layer formed over an p-type and n-type region of a substrate, according to some embodiments

According to some embodiments, a similar process that involves patterning a photoresist layer can be used to form an p-type region 400 in substrate 200, which is adjacent to n-type region 320, as shown in FIG. 4. In some embodiments, the p-type region can be created with an ion implantation process using a p-type dopant such as boron (B). By way of example and not limitation, p-type region 400 can have a dopant concentration that ranges from about $5\times10^{16}$ atoms/cm$^3$ to about $1\times10^{19}$ atoms/cm$^3$.

After the formation of n- and p-type regions 320 and 400, any remaining photoresist layer can be removed with a wet clean process. In some embodiments, an annealing step is performed to electrically activate the dopants (e.g., move the dopants from interstitial sites to silicon lattice sites) and repair any silicon crystal damage which occurred during the ion implantation step. By way of example and not limitation, crystal damage repair can occur at about 500° C. and dopant activation can occur at about 950° C. By way of example and not limitation, the annealing step can be performed in an annealing furnace or in a rapid thermal anneal (RTA) chamber. According to some embodiments, oxide layer 210 can be removed after the dopant activation anneal.

In referring to FIG. 1, in operation 120, a Si layer 410 can be epitaxially grown directly on substrate 200 as shown in FIG. 4. In some embodiments, Si epitaxial layer 410 can have a thickness range between about 300 Å to about 1000 Å. By way of example and not limitation, Si epitaxial layer 410 can be deposited with a chemical vapor deposition process. Possible source gases for the silicon epitaxial formation may include silane ($SiH_4$), silicon tetrachloride ($SiCl_4$), trichlorosilane (TCS), or dichlorosilane ($SiH_2Cl_2$ or DSC). Hydrogen ($H_2$) can be used as a reactant gas that reduces the aforementioned source gases. The deposition temperature during the epitaxial layer formation can range from about 700° C. to about 1250° C. depending on the gases used. For example, source gases with fewer chlorine atoms (e.g., DSC) may require lower formation temperatures compared to source gases with more chlorine atoms, such as $SiCl_4$ or TCS. The aforementioned ranges and type of gases are provided as examples and are not limiting.

A cap layer 420 can be grown on top of Si epitaxial layer 410, according to some embodiments. The cap thickness layer 420 can have a thickness of 150 Å or more (e.g., from about 150 Å to about 300 Å). In some embodiments, cap layer 420 can be an oxide layer such as SiO$_2$. Alternatively, cap layer 420 can be a nitride, such as Si$_3$N$_4$.

Figure 5:
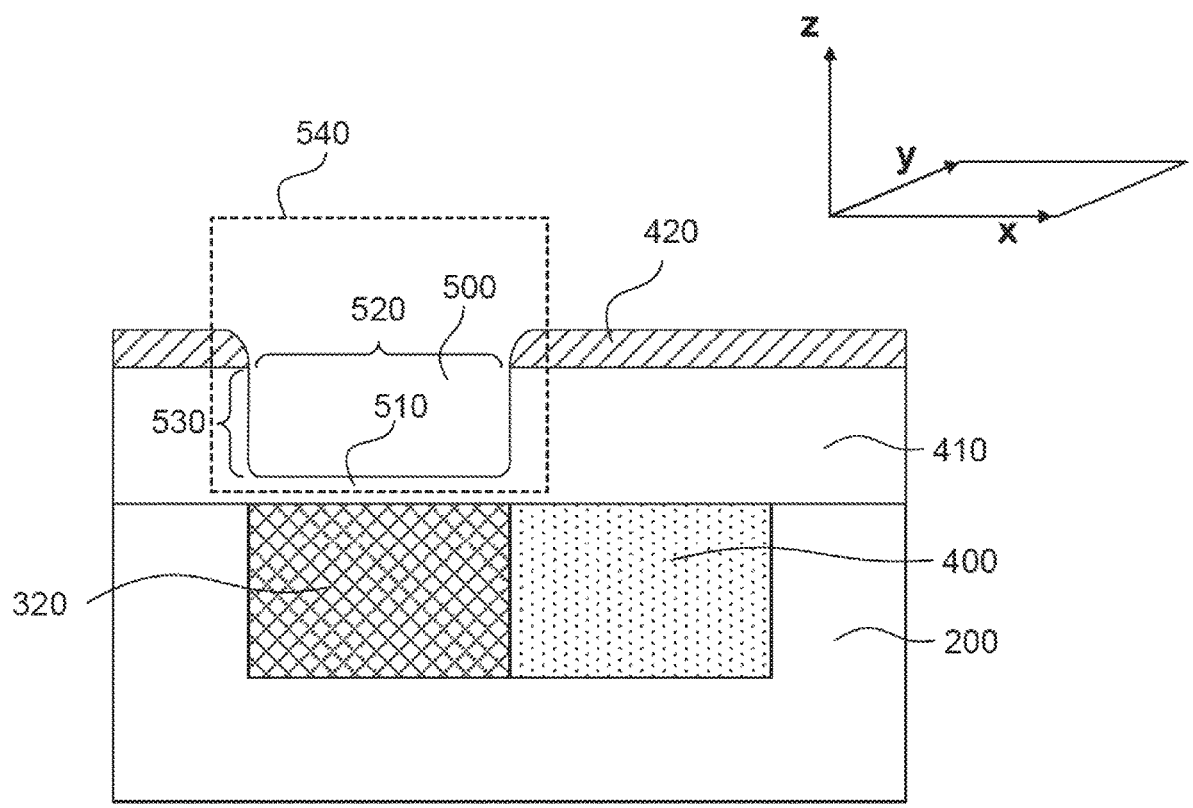
FIG. 5 is a cross sectional view of a recess formed in a silicon epitaxial layer after an etch operation, according to some embodiments.

Referring to FIG. 5 and to operation 130, a well, or recess, 500 can be formed in Si epitaxial layer 410 using a dry etch process. In some embodiments, well 500 can be aligned to n-type region 320. In some embodiments, at least one dimension of well 500 is nominally equal to a dimension of n-type region 320. For example, they can have equal width along the x-axis but different length along the y-axis. Alignment of well 500 with n-type region 320 can be achieved, for example, through photolithography. By way of example and not limitation, a coat of photoresist can be applied on Si epitaxial layer 410. The photoresist can be exposed and developed according to a desired pattern, for example, a desired pattern could be openings, which are aligned to n-type region 320 and expose a portion of cap layer 420. The unexposed areas of the photoresist can be removed with a wet clean, leaving behind the desired pattern of developed photoresist on cap layer 420 (e.g., on Si epitaxial layer 410 and cap layer 420, over p-type region 400). A dry etch process can remove exposed areas of cap layer 420 and partially etch Si epitaxial layer 410. Areas of cap layer 420 covered with the developed photoresist (e.g., on top of p-type region 400) are protected from the etch chemistry of the dry etch process and therefore not etched. Once the exposed area of cap layer 420 is etched and Si epitaxial layer 410 is partially etched, the remaining developed photoresist can be removed with a wet clean. The result of this process is etched portions in Si epitaxial layer 410, like well 500 shown in FIG. 5. The dry etch process that forms well 500 in Si epitaxial layer 410 can be timed so that a thin Si epitaxial layer on top of n-type region 320 is not removed, as described above. According to some embodiments, the thickness of the remaining Si layer 510 on top of n-type region 320 can range from about 50 Å to about 100 Å. According to some embodiments, Si layer 510 was originally deposited as part of Si epitaxial layer 410. In some embodiments, the dry etch process can use a different gas chemistry for cap 420 layer and Si epitaxial layer 410.

In some embodiments, well 500 in Si epitaxial layer 410, has a width 520 and a height 530. Width 520 can range from about 1000 Å to about 5000 Å and can be nominally equal to the width of n-type region 320. Height 530 of well 500 can be equal to the difference between the thickness of Si epitaxial layer 410 and the thickness of Si layer 510 at the bottom of well 500.

In some embodiments, after the formation of well 500 in Si epitaxial layer 410, the edges of cap layer 420 at the top corners of well 500 can become rounded. Rounding of cap layer 420 at the corners of well 500 can be attributed to the etch process. Additionally, during the etch process, a portion of cap layer 420 may be etched, and therefore cap layer 420 may become thinner by the end of the etch process.

In referring to FIG. 1, in operation 140, one or more surface pre-clean treatment cycles can be performed to prepare the surface of well 500 for the subsequent epitaxial layer formation. According to some embodiments, a surface pre-clean treatment cycle can include a two-step process: a plasma etch step and an anneal step. In some embodiments, the surface pre-clean treatment cycle can be repeated; for example, two or more surface pre-clean treatment cycles may be performed. In some embodiments, the surface pre-clean treatment is designed to treat exposed surfaces of well 500 in Si epitaxial layer 410. Surfaces of Si epitaxial layer 410 that are covered by cap layer 420 (e.g., the top surface of Si epitaxial layer 410 over p-type region 400) are not exposed to the surface pre-clean treatment and therefore not treated.

In some embodiments, the plasma etch step can include a mixture of nitrogen trifluoride (NF$_3$) and ammonia (NH$_3$) gases. The plasma may also include inert gases such as argon (Ar), helium (He), hydrogen (H$_2$), nitrogen (N$_2$), or a combination thereof. According to some embodiments, the power provided to the plasma can be either radio frequency (RF) or direct current (DC). By way of example and not limitation, the plasma etch can be performed at room temperature to about 150° C., at a pressure range from about 0.5 Torr to about 10 Torr (e.g., from 2 to 5 Torr). However, the aforementioned process ranges are not limiting since they are equipment dependent. According to some embodiments, the plasma etch can remove native silicon oxide (SiO$_x$) and/or contaminants, such as carbon, fluorine, chlorine, and phosphorous from the exposed surfaces of well 500. In some embodiments, the plasma etch may include hydrochloric acid (HCl) vapors.

Figure 6:
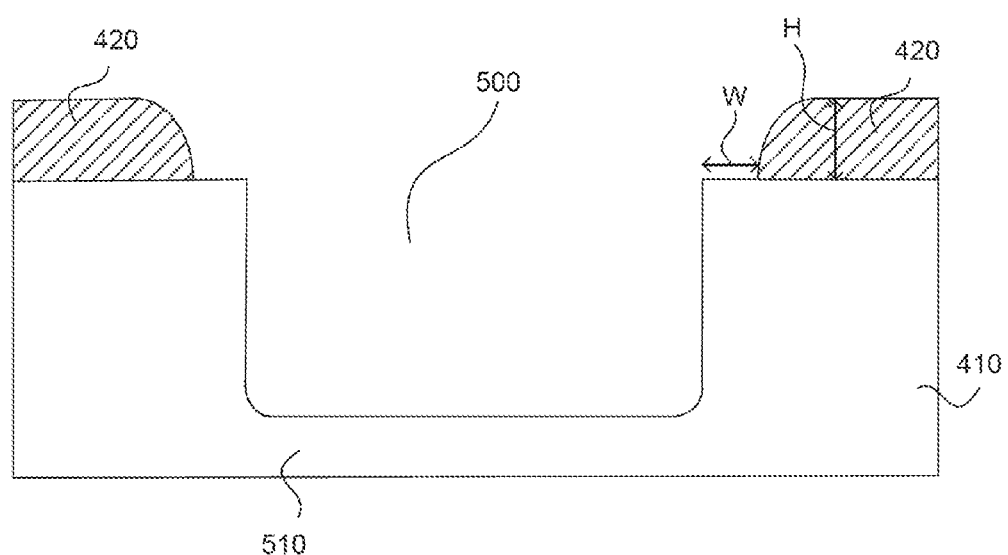
FIG. 6 is a cross sectional view of a recess in a silicon epitaxial layer after a surface pre-clean treatment operation, according to some embodiments.

FIG. 6 is a magnified view of an area 540 of FIG. 5, which shows well 500 after exposure to NF$_3$ and NH$_3$ plasma. Since NF$_3$ and NH$_3$ plasma targets silicon oxide, a portion of cap layer 420 will be etched during the plasma etch process. Consequently, the thickness of cap layer 420 at the top of Si epitaxial layer 410 (or height H) is reduced. Additionally, a recess, having a width W, will be formed at the top corners of well 500. As described earlier, the rounding of cap layer 420 occurred during the well formation. In some embodiments, height H can be larger or equal to recess width W (e.g., H≥W). For example, a ratio between height H and width W (H/W) of the recessed cap layer 420 can range from about 1 to 1.5. In some embodiments, height H of cap layer 420 can be reduced by about 50 Å to 200 Å depending on the plasma etch conditions, the number of surface pre-clean treatment cycles, or the duration of each surface pre-clean treatment cycle. In some embodiments, the thickness of cap layer 420 can be modulated to mitigate loading effects during an etch process so that chip areas having different densities can be uniformly etched. For example, logic areas of the chip, static random access memory (SRAM) areas of the chip, or areas of the chip where input/output devices (I/O) are located may have a different device density. In some embodiments, the thickness of cap layer 420 can be further controlled via diluted hydrofluoric acid (DHF) before a subsequent chemical planarization process (CMP). In some embodiments, there is a correlation between the thickness of cap layer 420 and CMP loading between areas of the chip that have different densities, e.g., logic and SRAM. Therefore, the thickness of cap layer 420 can also be used to mitigate polish rate differences (loading) between high-density areas (e.g., SRAM) and low-density areas (e.g., logic) of the chip.

The surface pre-clean treatment cycle continues with an anneal step. The anneal step can be performed from about 30° C. to about 200° C. (e.g., from 60° to 200°). In some embodiments, the anneal step can be performed at a lower pressure than the plasma etch step; at a pressure lower than 1 Torr (e.g. 0.6 Torr). According to some embodiments, the ambient during the anneal step can be an inert gas such as Ar, He, N$_2$, or a combination thereof. In some embodiments, the anneal step can induce outgassing of contaminants and moisture from the surfaces of well 500. According to some embodiments, the anneal step can last up to about 30 s (e.g., 25 s). As discussed above, the surface pre-clean treatment (plasma etch and anneal) can be repeated as required to prepare the exposed surfaces of Si epitaxial well 500.

In some embodiments, each cycle of surface pre-clean treatment may include one of the following sequences: (i) a combination of an anneal, an etch, and an anneal, (ii) a combination of an etch and an anneal; (iii) an etch without an anneal. In some embodiments, each of the aforementioned sequences can have a different native oxide removal rate. As a result, for each of the aforementioned sequences, different number of cycles may be required. For example, sequences (i) and (ii) may require 2 cycles, while sequence (iii) may require a single cycle. In some embodiments, skipping an anneal may improve the etch uniformity within a wafer (within wafer etch uniformity, or WTW etch uniformity). According to some embodiments, the amount of native oxide removed can range from about 30 Å to about 120 Å.

Fabrication method 150 continues with operation 150 and the formation of an epitaxial layer in the well. According to some embodiments, operation 150 includes three sub-operations: (i) a prebake, (ii) a formation of a seed layer, and (iii) a formation of an epitaxial layer on the seed layer.

According to some embodiments, the first sub-operation is a heat treatment, or a prebake, performed at a temperature T1 that can be higher than the subsequent seed and epitaxial layer formation temperatures T2 and T3 respectively. In other words. T1>T2, T3. For example, the prebake temperature T1 can be about 20% to about 30% higher than the seed and epitaxial layer formation temperatures T2 and T3. According to some embodiments, the prebake temperature can range from about 650° C. to about 1500° C. (e.g., 650° C. to 900° C. or 1000° C. to 1500° C.). In some embodiments, the prebake ambient can be an inert gas such as Ar, $N_2$, He, or combinations thereof. In addition, the prebake pressure can range from about 1 Torr to about 500 Torr (e.g. 10 Torr to 50 Torr, or 200 Torr to 300 Torr). By way of example and not limitation, if the prebake temperature is high, the prebake pressure can be low and vice versa. For example, for a prebake temperature range of about 1000° C. to about 1500° C., the prebake pressure can range from about 10 Torr to about 50 Torr. Conversely, for a prebake temperature range of about 650° C. to about 900° C., the prebake pressure can range from about 200 Torr to about 300 Torr. In some embodiments, the prebake time can range from about 50 s to about 200 s (e.g., 100 s). According to some embodiments, the prebake process may reduce the surface roughness of the Si epitaxial well and mitigate width changes or sidewall tapering. According to some embodiments, after the prebake step the sidewalls of well 500 can form an angle equal or greater than 90° with the bottom surface of well 500.

In the second sub-operation of operation 150, a seed layer is formed on exposed surfaces of Si epitaxial layer 410 that are not masked by cap layer 420, such as well 500. According to some embodiments, the seed layer cannot be grown on cap layer 420; for example, the seed layer cannot grow on $SiO_2$ or $Si_3N_4$. According to some embodiments, the seed layer may be a Si layer, Si:C layer, a SiGe layer, or a combination thereof with a thickness that ranges from about 30 Å to about 100 Å. For example, a seed layer can be Si/Si:C/SiGe, Si/SiGe, or Si:C/SiGe. According so some embodiments, the atomic percentage (at. %) of carbon dopant in Si:C can be from about 0.01 at. % to about 2 at. %. In some embodiments, the seed layer is not sufficiently thick to fill well 500. As a result, the seed layer covers the exposed surfaces of well 500 and cannot fill the Si epitaxial well 500. By way of example and not limitation, the seed layer can be deposited by CVD. By way of example and not limitation, $SiH_4$ and/or DCS can be used in the presence of $H_2$ or $N_2$ to form a Si seed layer. A combination of (i) $SiH_4$, disilane ($Si_2H_6$), germane ($GeH_4$), or hydrochloric acid (HCl), and (ii) $H_2$, $N_2$, He or Ar can be used to form a SiGe seed layer. The aforementioned types of gases are exemplary and not limiting.

In some embodiments, seed layer deposition temperature T2 may be greater than growth temperature T3 of the epitaxial layer. Seed layer deposition temperature T2 can range from about 600° C. to about 750° C. (e.g., 700° C. to 750° C.) According to some embodiments, a higher quality seed layer (e.g., with fewer defects) can be achieved at the upper limit of the T2 range (e.g., about 750° C.). In some embodiments, the seed layer formation process can range from about 5 Torr to about 30 Torr (e.g., 15 Torr). According to some embodiments, the seed layer deposition process time can range from about 5 s to about 15 s depending on the seed layer growth rate and the desired seed layer thickness. The aforementioned ranges are exemplary and not limiting. In some embodiments, in cases where width 520 of well 500 has "expanded" due to prior processing, the thickness of the seed layer can be adjusted to recover the intended width 520 of well 500. These thickness adjustments can also mitigate a top and bottom corner rounding in well 500.

In the third sub-operation of operation 150, an epitaxial layer is formed on the seed layer to fill Si epitaxial well 500. According to some embodiments, the epitaxial layer is SiGe and can be grown at a temperature T3. Growth temperature T3 can range from about 550° C. to about 700° C. As discussed above, T3 can be lower than T2 and T1. By way of example and not limitation, precursor gases that can be used for the SiGe epitaxial layer growth may include a combination of (i) $SiH_4$, $Si_2H_6$, $SiH_2Cl_2$, $GeH_4$, or HCl, and (ii) $H_2$, $N_2$, or Ar.

In some embodiments, the Ge concentration in atomic percentage (at. %) is constant throughout the thickness (e.g., along the z-direction) of the SiGe epitaxial layer and can range from about 20 at. % to about 40 at. %. In some embodiments, the SiGe epitaxial layer may include a first sub-layer that has a Ge concentration up to about 5 at. %, and a second sub-layer with a constant Ge concentration throughout the thickness of the SiGe epitaxial layer ranging from about 20 at. % to about 40 at. %. The thickness of the first sub-layer can range from about 20 Å to about 100 Å.

Figure 7:
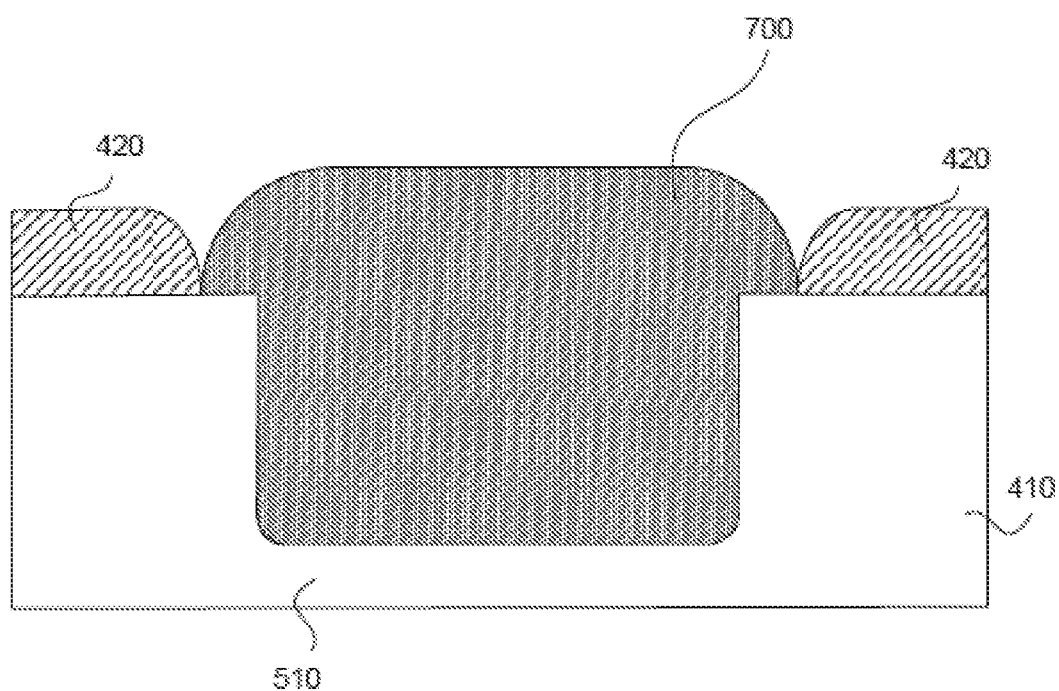
FIG. 7 is a cross sectional view of a silicon germanium epitaxial layer grown in a recess within a silicon epitaxial layer, according to some embodiments.

Referring to FIG. 7, a SiGe epitaxial layer 700 is grown in Si epitaxial well 500 of FIG. 6. SiGe epitaxial layer 700 grows over the seed layer. Furthermore, SiGe epitaxial layer 700 cannot grow on capping layer 420; for example, SiGe epitaxial layer 700 cannot grow on $SiO_2$ or $Si_3N_4$. According to some embodiments, the sidewalls of well 500, after the growth of SiGe epitaxial layer 700, can be substantially vertical in relation to the bottom surface of well 500; for example, the angle between the bottom surface of well 500 and a sidewall of well 500 can range from about 90° to about 100°. By way of example and not limitation, for the formation of an NFSC, a Si:C epitaxial may be grown on a Si seed layer over a p-type region. In some embodiments, a subsequent CMP process can planarize the SiGe epitaxial layer 700 and Si epitaxial layer 410. During the CMP operation, the cap layer 420, and a portion of SiGe epitaxial layer 700/Si epitaxial layer 410, can be removed as shown in FIG. 8.

In some embodiments, the aforementioned sub-operations of operation 150 are successively performed without a vacuum break. For example, each sub-operation is performed in a different reactor of a single mainframe. In other words, the operation 150 of exemplary fabrication method 100 is an in-situ process.

Figure 8:
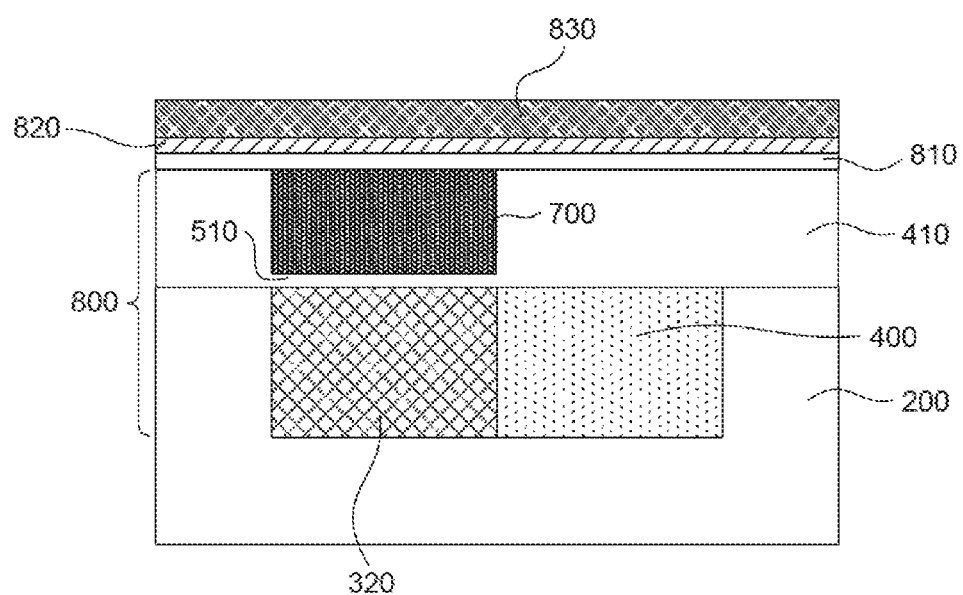
FIG. 8 is a cross sectional view of silicon germanium epitaxial layer grown in a recess within a silicon epitaxial layer after a chemical mechanical planarization operation and depositions of a silicon layer, an oxide layer, and a nitride layer, according to some embodiments.

In referring to FIG. 1, in operation 160 of exemplary fabrication process 100, portions of stack 800 shown in FIG. 8 can be etched to form a fin, or fins, which can include a bottom section made of n-type region 320, a middle section made of Si layer 510, and top section made of a seed layer and SiGe epitaxial layer 700, according to some embodiments. In some embodiments, fins can also be formed to include a bottom section made of p-type region 400 and a top section made of Si epitaxial layer 410.

By way of example and not limitation, the fin formation process may start with the deposition of a Si layer 810 over the planarized surfaces of SiGe epitaxial layer 700 and Si epitaxial layer 410. In some embodiments, the thickness of the Si layer can range from about 10 Å nm to about 100 Å (e.g., 30 Å) and can be grown with similar methods used to grow Si epitaxial layer 410. Subsequently, an oxide layer 820 and a nitride layer 830 can be deposited over the Si layer. Oxide, nitride, and Si layers (810, 820, and 830, respectively) can protect the epitaxial layers 700 and 410 during subsequent etch processes. Photolithography can define the size and spacing (pitch) of the fins. For example, a photoresist layer can be coated over the nitride layer. The photoresist can be then exposed and developed according to a desired pattern. The unexposed areas of the photoresist can be removed with a wet clean, leaving behind the desired pattern of developed photoresist on nitride layer 830. For example, a desired pattern could be openings that would determine the desired fin-pitch (e.g., desired distance between fins) and fin length. The photoresist acts as an etch mask so that stack material not masked by the photoresist can be removed.

Figure 9:
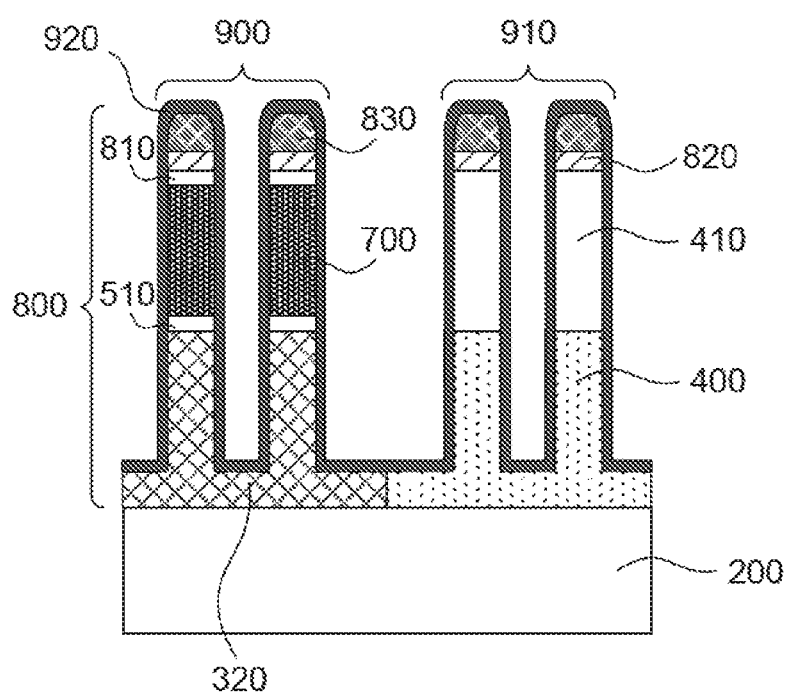
FIG. 9 is a cross sectional view of fins with silicon germanium and silicon epitaxial layers formed thereon, according to some embodiments.

A dry etch process can, for example, remove material from stack 800 that is not covered by the patterned photoresist. By way of example and not limitation, the dry etch process may include several steps—each one of which can have a different etch chemistry depending on the material to be etched. After the etch process, the developed photoresist can be removed with a wet clean. According to some embodiments, the resulting fin structures 900 and 910 are shown in FIG. 9. The number of fins shown in FIG. 9 are exemplary and not limiting. Therefore, fewer or additional fins may be possible depending on the fin pitch and the desired width of each fin. According to some embodiments, fins 900 can include a bottom section of n-type region 320, a middle section of Si epitaxial layer 510, and a top section of a seed layer and SiGe epitaxial layer 910. Fin structures 910 can include a bottom section made of p-type region 400 and a top section made of Si epitaxial layer 410.

Figure 10:
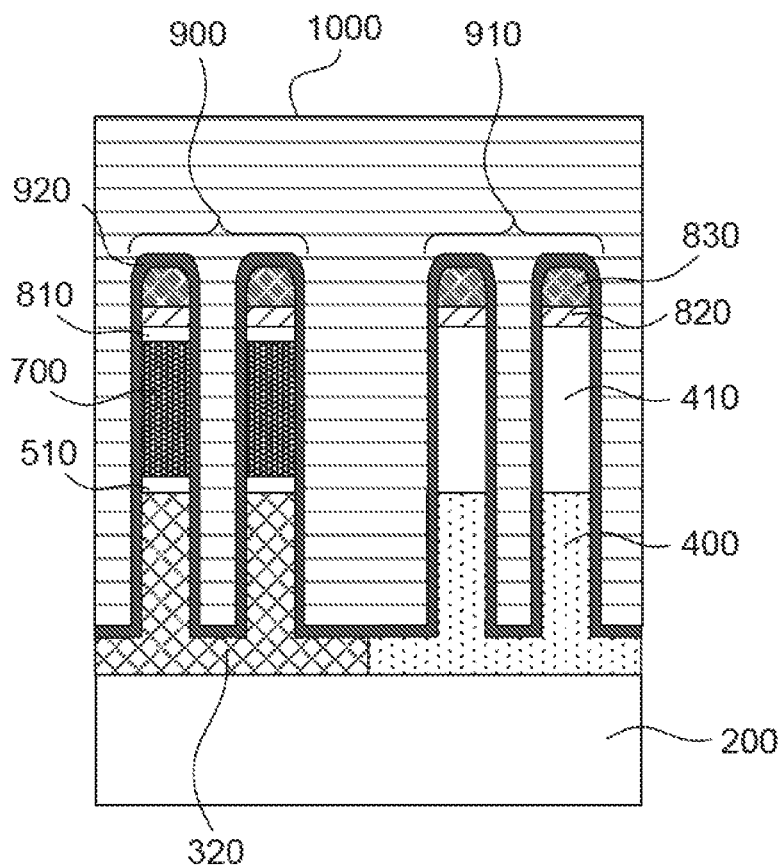
FIG. 10 is a cross sectional view of fins with silicon germanium and silicon epitaxial layers after the deposition of a dielectric layer between the fins, according to some embodiments.

In some embodiments, a nitride liner 920 can be deposited over fins 900 and 910 to cover the sidewall surfaces of fins 900, 910 and horizontal surfaces of p-/n-type regions 320 and 400. Nitride liner 920 can be, for example, $Si_3N_4$. In some embodiments, nitride liner 920 can provide structural support to fins 900 and 910 during subsequent processing. In some embodiments, a dielectric layer 1000 can be deposited over fins 900 and 910 to fill the space between the fins, as shown in FIG. 10. Dielectric layer 1000 can be, for example, a shallow trench isolation (STI) made of silicon oxide, silicon nitride, silicon oxynitride, fluorine-doped silicate glass (FSG), a low-k dielectric material, and/or other suitable insulating material with appropriate fill properties. Additionally, the dielectric layer may include a multi-layer structure, for example, having one or more dielectric layers. In some embodiments, the dielectric layer may be deposited with CVD, plasma enhanced CVD (PECVD), or flowable CVD (FCVD).

Figure 11:
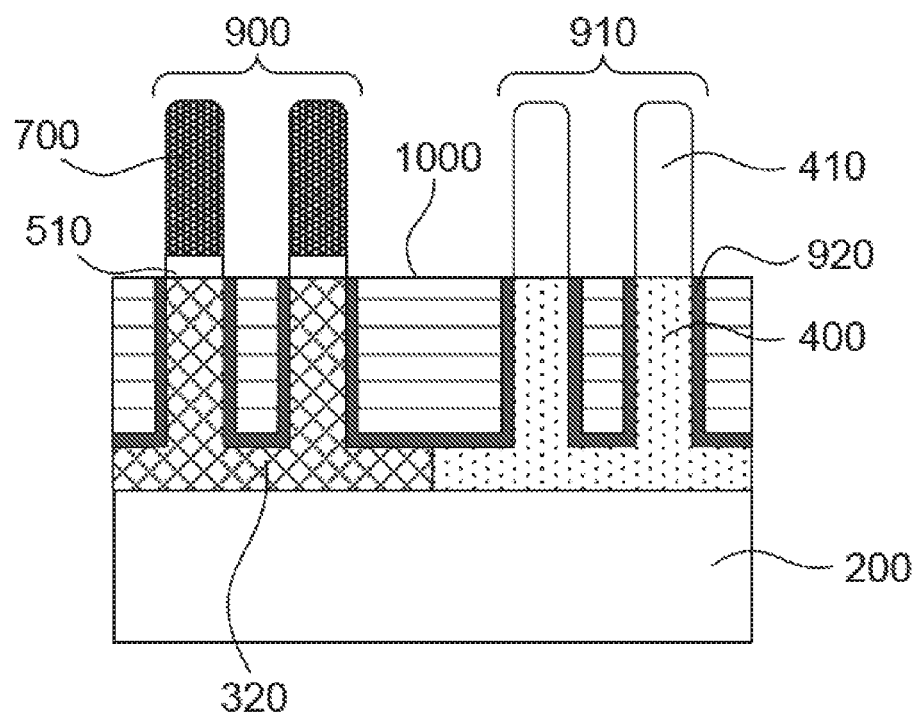
FIG. 11 is a cross sectional view of fins with silicon germanium and silicon epitaxial layers after the recess process of a dielectric layer located between the fins, according to some embodiments.

According to some embodiments, a CMP process can remove a portion of dielectric layer 1000 over fins 900 and 910. In some embodiments, the CMP process can stop on nitride liner 920. Subsequent etchback processes can recess dielectric layer 1000 at the level of n- and p-type regions as shown in FIG. 11. During the aforementioned etchback operations, nitride layer 830, oxide layer 820, and Si layer 810 can be removed. In addition, nitride liner 920 can also be recessed to the level of dielectric layer 1000.

As discussed above, exemplary method 100 can be used to form an NFSC. For example, this can be accomplished by forming a p-type doped region in operation 110, and growing a carbon doped silicon (Si:C) as the epitaxial layer in operation 150 on a Si seed layer.

The present disclosure is directed to an exemplary fabrication method of p-type or n-type fully strained channels that can mitigate epitaxial growth defects in a channel region, such as stacking faults. In addition, the exemplary fabrication method can mitigate structural deformations in a channel region, such as sidewall tapering, due to processing. According to some embodiments, the exemplary fabrication process can include (i) two or more surface pre-clean treatment cycles with nitrogen trifluoride ($NF_3$) and ammonia ($NH_3$) plasma, followed by a thermal treatment; (ii) a prebake (anneal); and (iii) a SiGe epitaxial growth with a Si seed layer, or a SiGe seed layer, or a combination thereof; or a Si:C epitaxial growth with a Si seed layer. In some embodiments, fins can be formed that can include a bottom section with a doped region, a middle section with a silicon epitaxial layer, and an a top section with a seed and an epitaxial layer.

In some embodiments, a method includes a doped region formed on a top portion of a substrate and a first epitaxial layer grown on the doped region. A well, which is substantially aligned to the doped region, is formed in the first epitaxial layer. Forming the well includes, partially etching the first epitaxial layer and performing one or more surface pre-clean treatment cycles. Each surface pre-clean treatment cycle includes: exposing the well to a plasma, performing an anneal, and forming a second epitaxial layer in the well. Forming the second epitaxial layer includes: performing a prebake at a first temperature, forming a seed layer in the well at a second temperature, and forming the second epitaxial layer on the seed layer at a third temperature to fill the well.

In some embodiments, a method includes an n-type region formed on a top portion of a substrate and a silicon epitaxial layer grown on the doped region. A dielectric layer formed on the silicon epitaxial layer. An opening, which is aligned to the n-type region, is formed in the dielectric layer to expose the silicon epitaxial layer. Further, the silicon epitaxial layer is partially etched through the opening to form a recess. A pre-clean treatment cycle is performed and an epitaxial stack is formed in the recess, where forming the epitaxial stack includes: performing a prebake, forming a seed layer in the recess, and forming the epitaxial layer on the seed layer to fill the recess.

In some embodiments, a structure includes a fin over a substrate, where the fin includes: an n-type doped region over the substrate, a silicon epitaxial layer over the n-type doped region, and an epitaxial stack over the silicon epitaxial layer. Further, a liner is surrounding the n-type doped region of the fin and a dielectric is surrounding the liner.

The foregoing outlines features of embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
providing a doped region on a top portion of a substrate;
growing a first epitaxial layer on the doped region;
forming a well in the first epitaxial layer that is aligned to the doped region, wherein the well comprises a bottom surface of the first epitaxial layer;
performing one or more surface pre-clean treatment cycles, wherein each surface pre-clean treatment cycle comprises:
exposing the well to a plasma; and
performing an anneal at an annealing temperature; and
forming, after performing the one or more surface pre-clean treatment cycles, a second epitaxial layer in the well, wherein forming the second epitaxial layer comprises:
performing a prebake at a first temperature different from the annealing temperature;
forming a seed layer on the bottom surface of the first epitaxial layer at a second temperature; and
forming the second epitaxial layer on the seed layer at a third temperature to fill the well.

2. The method of claim 1, further comprising:
disposing a photoresist over the second epitaxial layer;
forming at least two openings in the photoresist to expose at least two respective portions of the second epitaxial layer; and
forming a fin, wherein forming the fin comprises:
etching through the at least two openings in the photoresist to remove the second epitaxial layer, the seed layer, the first epitaxial layer, and a portion of the doped region; and
forming a dielectric layer around the fin.

3. The method of claim 2, wherein the fin comprises a bottom section with the doped region, a middle section with the first epitaxial layer, and a top section with the seed and the second epitaxial layer.

4. The method of claim 1, wherein, after forming the second epitaxial layer, the well has a sidewall angle between 90° and 100°.

5. The method of claim 1, wherein the doped region comprises an n-type material.

6. The method of claim 1, wherein the plasma comprises nitrogen trifluoride ($NF_3$), ammonia ($NH_3$), and an inert gas.

7. The method of claim 1, wherein the seed layer comprises silicon, carbon doped silicon, a silicon germanium, or a combination thereof with a thickness between 10 Å and 100 Å.

8. The method of claim 1, wherein the first temperature ranges from 650° C. to 1500° C. and is higher than the second and third temperatures.

9. The method of claim 1, wherein the second temperature is higher than the third temperature, the second temperature is selected from a range of 600° C. to 750° C. and the third temperature is selected from a range of 500° C. to 700° C.

10. The method of claim 1, wherein the first epitaxial layer comprises silicon, and the second epitaxial layer comprises silicon germanium.

11. A method, comprising:
forming a n-type region on a top portion of a substrate;
growing a silicon epitaxial layer on the n-type region;
forming a dielectric layer on the silicon epitaxial layer;
forming an opening in the dielectric layer that is aligned to the n-type region to expose the silicon epitaxial layer;
partially etching the silicon epitaxial layer through the opening to form a recess in the silicon epitaxial layer, wherein the recess comprises a bottom surface of the silicon epitaxial layer;
performing a pre-clean treatment cycle comprising an anneal; and
forming, after performing the pre-clean treatment cycle, an epitaxial stack in the recess, wherein forming the epitaxial stack comprises:
performing a prebake at a temperature higher than that of the anneal;
forming a seed layer on the bottom surface of the silicon epitaxial layer; and
forming the epitaxial layer on the seed layer to fill the recess.

12. The method of claim 11, wherein performing the pre-clean treatment cycle comprises exposing the recess to a plasma.

13. The method of claim 11, further comprising:
forming fins, wherein forming the fins comprises:
disposing a photoresist over the epitaxial layer;
forming at least two openings in the photoresist to expose at least two respective portions of the epitaxial layer;
etching through the at least two openings in the photoresist to remove the epitaxial layer, the seed layer, the silicon epitaxial layer, and a portion of the n-type region; and
forming a dielectric layer between the fins.

14. The method of claim 11, wherein the epitaxial layer is silicon germanium.

15. The method of claim 11, wherein the seed layer comprises silicon, silicon germanium, carbon doped silicon, or a combination thereof.

16. The method of claim 12, wherein the plasma comprises nitrogen trifluoride ($NF_3$), ammonia ($NH_3$), and an inert gas.

17. The method of claim 12, wherein the anneal is performed at a temperature between 60° C. to 200° C. and at a pressure range between 0.2 Torr and 1 Torr.

18. A method, comprising:
forming fins on a substrate, the fins comprising a bottom portion with a doped region, a middle portion with a first epitaxial layer, and a top portion with a seed layer and a second epitaxial layer, and wherein forming the fins comprises:
forming the doped region on a top portion of the substrate;
epitaxially growing the first epitaxial layer on the doped region;
forming a recess in the first epitaxial layer over the doped region by etching the first epitaxial layer over the doped region, wherein the recess comprises a bottom surface of the first epitaxial layer;
exposing the recess to one or more surface pre-clean treatment cycles, wherein each of the one or more surface pre-clean treatment cycles comprises a plasma and an anneal at a first temperature;
epitaxially growing, after exposing the recess to the one or more surface pre-clean treatment cycles, the second epitaxial layer in the recess by performing a prebake at a second temperature different from the first temperature, depositing the seed layer on the bottom surface of the first epitaxial layer, and growing the second epitaxial layer on the seed layer;

removing portions of the second epitaxial layer, the seed layer, the first epitaxial layer, and the doped region to form the fins; and forming a dielectric layer between the fins.

19. The method of claim 18, wherein depositing the seed layer and growing the second epitaxial layer are performed at a third and a fourth temperature, respectively.

20. The method of claim 19, wherein the second temperature is higher than the third temperature and the fourth temperature, and the third temperature is higher than the fourth temperature.

* * * * *